(12) United States Patent
Stange

(10) Patent No.: US 6,252,893 B1
(45) Date of Patent: Jun. 26, 2001

(54) OPTICAL TRANSMITTING DEVICE

(75) Inventor: Herwig Stange, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/207,124

(22) Filed: Dec. 7, 1998

Related U.S. Application Data

(63) Continuation of application No. PCT/DE97/01177, filed on Jun. 5, 1997.

(30) Foreign Application Priority Data

Jun. 5, 1996 (DE) .............................................. 196 23 883

(51) Int. Cl.[7] .................................. H01S 3/13; H01S 3/00
(52) U.S. Cl. ................................... 372/38; 372/29; 372/30; 372/31
(58) Field of Search .................................. 372/38, 29, 30, 372/31

(56) References Cited

U.S. PATENT DOCUMENTS

| | | | |
|---|---|---|---|
| 5,212,707 | * 5/1993 | Heidel et al. ........................ | 372/50 |
| 5,337,323 | * 8/1994 | Rokugawa et al. .................... | 372/31 |
| 5,568,575 | * 10/1996 | Sato ..................................... | 385/16 |

* cited by examiner

*Primary Examiner*—Frank G. Font
*Assistant Examiner*—Armando Rodriguez
(74) *Attorney, Agent, or Firm*—Herbert L. Lerner; Laurence A. Greenberg; Werner H. Stemer

(57) ABSTRACT

At least one monitor laser having an associated monitor diode. The monitor diode is connected to an electronic circuit that controls the monitor laser, while correspondingly driving the semiconductor lasers in parallel, in such a way that an electrical signal from the monitor diode constantly has a preset value. This value and a nominal signal corresponding to the nominal value of the optical power of the monitor laser are used to form a correction variable. If a current flowing through a semiconductor laser exceeds the current through the monitor laser, weighted by the correction variable, then the power of the semiconductor laser is reduced. In this manner, the transmitting device is of simple construction and at the same time avoids unacceptably high powers in the semiconductor lasers.

11 Claims, 1 Drawing Sheet

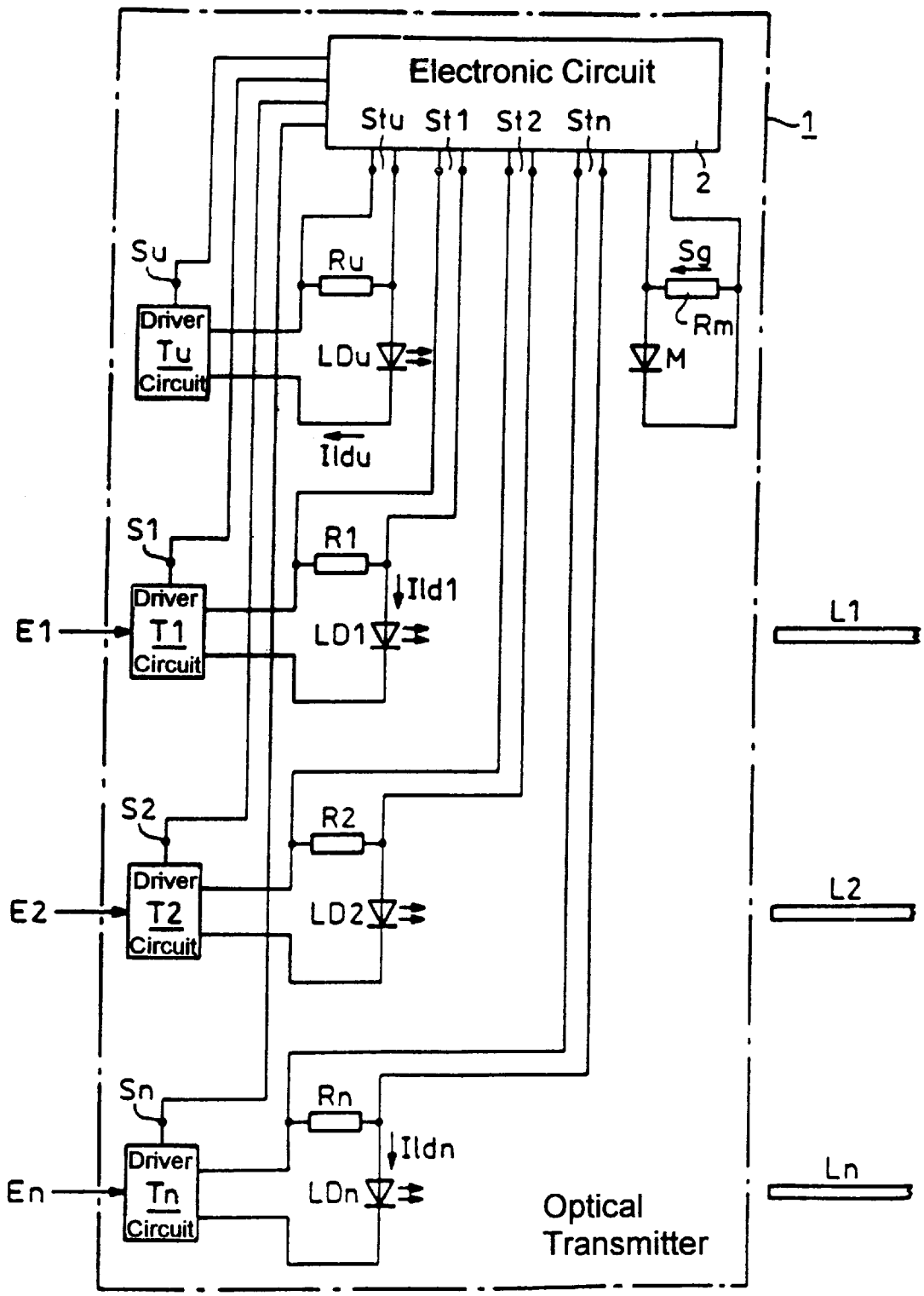

OPTICAL TRANSMITTING DEVICE

CROSS-REFERENCE TO RELATED APPLICATION

This is a continuation of copending International Application PCT/DE97/01177, filed Jun. 5, 1997, which designated the United States.

BACKGROUND OF THE INVENTION

Field of the Invention

The invention relates to an optical transmitting device having a number of semiconductor lasers situated next to one another.

An optical transmitting device of this type is described in Published, Non-Prosecuted British Patent Application GB 2 276 493 A. In the case of the known transmitting device, each semiconductor laser is constructed as an edge-emitting laser having a lens and a monitor diode associated with it. The monitor diode is used to produce an electrical variable that is proportional to the optical power output by the respectively associated laser. By an electronic circuit configuration which is not described in more detail in the publication, the electrical signal can be used to ensure that the respective semiconductor laser always outputs a constant light power in the event of temperature changes and as it ages. The configuration of the known optical transmitting device is comparatively complex inasmuch as each individual semiconductor laser has a monitor diode associated with it.

SUMMARY OF THE INVENTION

It is accordingly an object of the invention to provide an optical transmitting device which overcomes the above-mentioned disadvantages of the prior art devices of this general type, which is of relatively simple construction and which can be produced inexpensively.

With the foregoing and other objects in view there is provided, in accordance with the invention, an optical transmitting device, including: a plurality of semiconductor lasers disposed next to one another; a monitor diode; at least one monitor laser outputting an optical power received by the monitor diode, the monitor diode converting the optical power into an electrical signal; and an electronic circuit connected to the monitor diode and receiving the electrical signal: the electronic circuit controlling the at least one monitor laser and driving the plurality of semiconductor lasers in parallel; the electronic circuit controlling the at least one monitor laser such that the electrical signal constantly has a preset value corresponding to a specified maximum permissible optical power of the at least one monitor laser; the electronic circuit forming a correction variable from the preset value of the electrical signal and a nominal signal corresponding to a nominal value of the optical power of the at least one monitor laser; the electronic circuit having current measuring inputs for detecting currents through the plurality of semiconductor lasers and through the at least one monitor laser; and the electronic circuit outputting a control signal received by the plurality of semiconductor lasers for reducing a power output of a respective one of the plurality of semiconductor lasers if a magnitude of a current flowing through the respective one of the plurality of semiconductor lasers reaches that of a current through the at least one monitor laser weighted by the correction variable.

To achieve this object, in an optical transmitting device having a number of semiconductor lasers situated next to one another, the invention provides at least one monitor laser whose optical power is converted into an electrical signal by a monitor diode associated with the monitor laser. The monitor diode is connected to an electronic circuit that controls the monitor laser. The electronic circuit correspondingly drives the semiconductor lasers in parallel, such that the electrical signal constantly has a preset value corresponding to a specified maximum permissible optical power of the monitor laser. A correction variable is formed in the electronic circuit using the preset value of the electrical signal and a nominal signal corresponding to the nominal value of the optical power of the monitor laser. The electronic circuit uses current measuring inputs to detect the currents through the semiconductor lasers and through the monitor laser, and reduces the power of a semiconductor laser if the magnitude of the current flowing through the semiconductor laser reaches that of the current flowing through the monitor laser, weighted by the correction variable.

A substantial advantage of the transmitting device according to the invention is that not all of its semiconductor lasers are provided with a monitor diode, but a single monitor diode is associated merely with the monitor laser for the entire configuration of semiconductor lasers. As a result of this, the transmitting device according to the invention is comparatively easy to construct, which also results in reduced production costs. Furthermore, when constructing the transmitting device according to the invention, there is no need to consider the respective type of semiconductor lasers, because the configuration of the transmitting device according to the invention demands merely that attention be paid to the semiconductor lasers being able to readily output their light. In terms of circuitry, the transmitting device according to the invention creates no appreciable increase in complexity, as compared with the known device, because the wiring complexity created by connecting the current measuring inputs to the semiconductor lasers merely corresponds to the complexity required for connecting the monitor diodes used in the known transmitting device. Furthermore, the electronic circuit in the transmitting device according to the invention may easily be an ASIC, one or two additional circuit details of which are unimportant, as is known.

Any desired semiconductor laser may be used as the monitor laser in the transmitting device according to the invention. It is regarded as advantageous if the monitor laser is a semiconductor laser whose electro-optical behavior is virtually the same as that of the semiconductor lasers. This requirement can easily be met by virtue of the fact that the monitor laser and the semiconductor lasers are a constituent part of an array originating from one wafer. Consequently, it is a relatively simple matter to assess the current through the monitor laser.

It is regarded as particularly advantageous if the semiconductor lasers and the monitor laser are components (VCSEL—Vertical Cavity Surface Emitting Laser) which emit light on a single component side, because it would be a particularly complex matter to mount monitor diodes on every laser of this type.

When forming the correction variable in the electronic circuit, the bias current of the semiconductor laser diodes and also their differential gradient may also be taken into account besides the preset value, corresponding to a specified maximum permissible optical power of the monitor laser, and the nominal signal. With a sufficient approximation of the circumstances actually specified, a correction variable may be used which is obtained in the electronic circuit by forming the quotient of the preset value and the nominal value. The measured current through the respective semiconductor laser is weighted by forming the product of the correction variable and the measured current through the monitor laser.

In the transmitting device according to the invention, the current measuring inputs of the electronic circuit device are advantageously connected to resistors connected in series with the semiconductor lasers. Such resistors are generally always present, so that this type of current detection causes no additional complexity.

The transmitting device according to the invention may advantageously be a constituent part of an optical coupling point in which the transmitting device is opposite an optical reception element having a number of light-sensor elements situated next to one another and associated with the semiconductor lasers. A transmitting device of such a construction is disclosed per se in the above-mentioned British laid-open specification.

Other features which are considered as characteristic for the invention are set forth in the appended claims.

Although the invention is illustrated and described herein as embodied in an optical transmitting device it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The single FIGURE of the drawing is a block circuit diagram of an optical transmitting device according to the invention.

DESCRIPTION OF THE PREFERRED EMBODIMENTS

Referring now to the single FIGURE of the drawing in detail, there is shown an optical transmitting device 1 that has semiconductor lasers LD1 and LD2 to LDn. All the semiconductor lasers LD1 to LDn, which are preferably Vertical Cavity Surface Emitting Laser (VCSEL) laser diodes, each have a driver circuit T1 and T2 to Tn respectively disposed upstream. The driver circuits T1 to Tn are used to process, on the one hand, pulses that occur at inputs E1 and E2 to En of the driver circuits T1 to Tn for data transmission and, on the other hand, additionally, via further inputs S1, S2 to Sn, control variables provided by an electronic circuit 2, which are used to control the magnitude of the current through the individual semiconductor lasers LD1 to LDn. The semiconductor lasers LD1 to LDn are connected in series with resistors R1 and R2 to Rn, which are connected to current measuring inputs St1 and St2 to Stn of the electronic circuit 2.

The FIGURE also shows that the transmitting device 1 has a monitor laser LDu that is connected to the output of a driver circuit Tu via a further resistor Ru. The driver circuit Tu is connected via an input Su to one output of the electronic circuit 2. A current detection input Stu is used to detect the voltage drop across the resistor Ru and thus to measure the current through the monitor laser LDu.

As the FIGURE also shows, the monitor laser LDu has a monitor diode M associated with it which detects the optical power output by the monitor laser LDu. An electrical signal Sg, which forms an input signal for the electronic circuit 2, then occurs across a resistor Rm connected in series with the diode M.

The monitor laser LDu and the monitor diode M are used only to control and monitor the semiconductor lasers LD1 to LDn, while the semiconductor lasers LD1 to LDn are used for data transmission. To this end, the semiconductor lasers may respectively have optical fibers L1 and L2 to Ln disposed downstream which, preferably with the interposition of optical lens systems, pick up and transmit the light pulses output by the semiconductor lasers L1 to Ln.

If the optical power output by the monitor laser LDu, which corresponds to a specified maximum permissible optical power having been regulated accordingly by the electronic circuit 2, is denoted by Pmax, the bias current through each semiconductor laser LD1 to LDn by Ibias(T), where T is the respective temperature, and the differential gradient of the semiconductor lasers by η(T), then the maximum permissible current Imax through the semiconductor lasers may be expressed by the following relationship:

$$Imax = Ibias(T) + (Pmax/\eta(T)) \qquad (1)$$

Here, the differential gradient may be described by the following equation (2):

$$\eta(T) = Pnom/(Ildn(T) - Ibias(T)) \qquad (2)$$

where Ildn(T) denotes the respective current through the semiconductor lasers LD1 to LDn.

Taking equation (2) into account, equation (1) may then also be described in the form of equation (3) below:

$$Imax = Ibias(T) + (Pmax/Pnom)(Ildn(T) - Ibias(T)) \qquad (3)$$

This in turn readily gives the following equation (4) for the current Imax.

$$Imax = (1 - (Pmax/Pnom))Ibias(T) + (Pmax/Pnom)Ildn(T) \qquad (4)$$

Taking into account that the maximum permissible optical power of the monitor laser LDu is generally close to the optical nominal power of the semiconductor lasers LD1 to LDn, and the current Ildn through the semiconductor lasers LD1 to LDn is substantially larger than the bias current Ibias, the first expression on the right-hand side of equation (4) above can be disregarded because it tends to zero. Also taking into account that the variable Pmax and the differential gradient η(T) have an approximately similar temperature dependency, the current Imax can be described by the approximate equation (5) below:

$$Imax = (Pmax/Pnom)Ildn(T) \qquad (5)$$

Consequently, when operating the transmitting device according to the invention by the monitor diode M and the monitor laser LDu, it is sufficient to keep the maximum permissible optical power Pmax constant, which the electronic circuit 2 does using the electrical signal Sg by appropriately driving the monitor laser LDu, in order to form a correction variable in the electronic circuit 2 using the maximum permissible optical power Pmax and the nominal power Pnom of the monitor laser LDu, the correction variable corresponding to the quotient of Pmax and Pnom. The correction variable is multiplied by the respectively measured current Ildu through the monitor laser LDu in order to obtain Imax. If monitoring the currents through the semiconductor lasers LD1 to LDn establishes that, for example, the laser current Ild1 is assuming a value corresponding to that of the current Imax, then the electronic circuit 2 reduces the current through the semiconductor laser LD1 to a non-critical value, or turns the laser off completely, via the input S1 of the driver circuit T1 disposed upstream of the semiconductor laser. If the maximum permissible optical power Pmax is specified such that it guarantees eye safety, then the invention provides a transmitting device which can be classified as a Class 1 laser product.

I claim:

1. An optical transmitting device, comprising:
   a plurality of semiconductor lasers disposed next to one another;
   a monitor diode;
   at least one monitor laser outputting an optical power received by said monitor diode, said monitor diode converting the optical power into an electrical signal; and
   an electronic circuit connected to said monitor diode and receiving the electrical signal, said electronic circuit being configured to:
     control said at least one monitor laser and driving said plurality of semiconductor lasers in parallel;
     control said at least one monitor laser such that the electrical signal constantly has a preset value corresponding to a specified maximum permissible optical power of said at least one monitor laser;
     form a correction variable from the preset value of the electrical signal and a nominal signal corresponding to a nominal value of the optical power of the at least one monitor laser;
   said electronic circuit having current measuring inputs for detecting currents through said plurality of semiconductor lasers and through said at least one monitor laser; and
   said electronic circuit having an output outputting a control signal received by said plurality of semiconductor lasers for reducing a power output of a respective one of said plurality of semiconductor lasers if a magnitude of a current flowing through said respective one of said plurality of semiconductor lasers reaches that of a current flowing through said at least one monitor laser weighted by said correction variable.

2. The transmitting device according to claim 1, wherein said at least one monitor laser is a laser diode whose electro-optical behavior is susbstantially the same as that of said plurality of semiconductor lasers.

3. The transmitting device according to claim 1, wherein said plurality of semiconductor lasers and said at least one monitor laser are components emitting light on a single component side.

4. The transmitting device according to claim 1, wherein said electronic circuit derives said correction variable by forming a quotient of the preset value and the nominal value, and the current through said respective one of said plurality of said semiconductor lasers is weighted by forming a product of the correction variable and the current through said at least one monitor laser.

5. The transmitting device according to claim 1, including resistors connected in series with said plurality of semiconductor lasers, said current measuring inputs of said electronic circuit are also connected to said resistors.

6. An optical coupling point, comprising:
   said transmitting device according to claim 1; and
   an optical reception element opposite said transmitting device, said reception element having a number of light-sensor elements disposed next to one another and associated with said plurality of semiconductor lasers.

7. An optical transmitting device, comprising:
   a plurality of semiconductor lasers disposed next to one another;
   a monitor diode;
   at least one monitor laser outputting an optical power received by said monitor diode, said monitor diode converting the optical power into an electrical signal; and
   an electronic circuit connected to said monitor diode and receiving the electrical signal:
     having means for controlling said at least one monitor laser and driving said plurality of semiconductor lasers in parallel;
     having means for controlling said at least one monitor laser such that the electrical signal constantly has a preset value corresponding to a specified maximum permissible optical power of said at least one monitor laser;
     having means for forming a correction variable from the preset value of the electrical signal and a nominal signal corresponding to a nominal value of the optical power of the at least one monitor laser;
   said electronic circuit having current measuring inputs for detecting currents through said plurality of semiconductor lasers and through said at least one monitor laser; and
   said electronic circuit having an output outputting a control signal received by said plurality of semiconductor lasers for reducing a power output of a respective one of said plurality of semiconductor lasers if a magnitude of a current flowing through said respective one of said plurality of semiconductor lasers reaches that of a current flowing through said at least one monitor laser weighted by said correction variable.

8. The transmitting device according to claim 7, wherein said at least one monitor laser is a laser diode whose electro-optical behavior is susbstantially the same as that of said plurality of semiconductor lasers.

9. The transmitting device according to claim 7, wherein said plurality of semiconductor lasers and said at least one monitor laser are components emitting light on a single component side.

10. The transmitting device according to claim 7, wherein said electronic circuit is deriving said correction variable by forming a quotient of the preset value and the nominal value, and the current through said respective one of said plurality of said semiconductor lasers is weighted by forming a product of the correction variable and the current through said at least one monitor laser.

11. The transmitting device according to claim 7, including resistors connected in series with said plurality of
   a monitor diode;
   at least one monitor laser outputting an optical power received by said monitor diode, said monitor diode converting the optical power into an electrical signal; and
   an electronic circuit connected to said monitor diode and receiving the electrical signal, said electronic circuit being configured to:
     control said at least one monitor laser and driving said plurality of semiconductor lasers in parallel;
     control said at least one monitor laser such that the electrical signal constantly has a preset value corresponding to a specified maximum permissible optical power of said at least one monitor laser;

form a correction variable from the preset value of the electrical signal and a nominal signal corresponding to a nominal value of the optical power of the at least one monitor laser;

said electronic circuit having current measuring inputs for detecting currents through said plurality of semiconductor lasers and through said at least one monitor laser; and semiconductor lasers, said current measuring inputs of said electronic circuit are also connected to said resistors.

* * * * *